United States Patent [19]

Back

[11] Patent Number: 5,175,770

[45] Date of Patent: Dec. 29, 1992

[54] LEVEL CONTROL CIRCUIT FOR LOW AND MEDIUM SOUND

[75] Inventor: Dong-Cherl Back, Suweon, Rep. of Korea

[73] Assignee: SamSung Electronics Co., Ltd., Suwon, Rep. of Korea

[21] Appl. No.: 516,556

[22] Filed: Apr. 30, 1990

[30] Foreign Application Priority Data

Sep. 19, 1989 [KR] Rep. of Korea .............. 89-13787[U]

[51] Int. Cl.[5] .............................................. H03G 5/00
[52] U.S. Cl. ........................................ 381/98; 381/28
[58] Field of Search ...................... 381/28, 55, 98, 102, 381/27, 1

[56] References Cited

U.S. PATENT DOCUMENTS

| | | |
|---|---|---|
| 3,668,532 | 6/1972 | Potash . |
| 4,182,930 | 1/1980 | Blackmer ............................ 381/28 |
| 4,408,095 | 10/1983 | Ariga et al. ........................ 381/27 |
| 4,841,573 | 6/1989 | Fujita ................................. 381/27 |
| 4,982,435 | 1/1991 | Kato et al. ......................... 381/28 |
| 4,984,273 | 1/1991 | Aylward et al. ................... 381/98 |

Primary Examiner—Forester W. Isen
Attorney, Agent, or Firm—Robert E. Bushnell

[57] ABSTRACT

A level control circuit for low and medium sound having an audio signal amplification output circuit, a low and medium sound signal detection circuit, and an amplification output circuit includes a control signal detection circuit for detecting a peak of the output signal and a gain control circuit for controlling a signal gain according to the output of the control signal detection circuit. The level control circuit may drive an exclusive speaker for low and medium sound with controlling the gain of the low and medium sound signal detected from left and right audio signals.

7 Claims, 1 Drawing Sheet

LEVEL CONTROL CIRCUIT FOR LOW AND MEDIUM SOUND

BACKGROUND OF THE INVENTION

The present invention relates to an audio system, and particularly to a level control circuit for low and medium sound which produces a low and medium sound level being controlled automatically among audio signals.

In general, an exclusive speaker for low and medium sound is installed in an audio system to improve the sound quality of an audio signal which is provided to the speakers. Also, it is necessary for the exclusive speaker to be driven by the low and medium sound signal which is detected from the audio signal.

As such, the conventional level control circuit for a low and medium sound signal is such that the applied audio signals are shaped in a buffer and then amplified the shaped signal through an amplifier, and provide this signal to the speakers located on the left and the right side.

The left and right audio signals which are provided for driving the speakers are added by an adder, the low and medium sound signal is filtered from the added audio signals by a low pass filter. This filtered low and medium sound signal is amplified by a LPF signal amplifier. Finally, the amplified low and medium sound signal drives the exclusive speaker for low and medium sound.

In the conventional level control circuit for low and medium sound, however, the level for low and medium sound may be controlled only by a manual control where the selection and gain control of the low and medium signal output is performed by an external volume control. Accordingly, a user should control the low and medium signal output in everything to get a low and medium sound effect.

SUMMARY OF THE INVENTION

It is an object of the present invention to provide a level control circuit for low and medium sound which detects a peak value of a low and medium sound signal and controls automatically an output gain of the low and medium sound signal according to the variation of the peak of the low and medium sound signal.

According to the present invention, there is provided a level control circuit for low and medium sound including an audio signal amplification output circuit for amplifying left and right audio signals, a low and medium sound signal detection circuit for detecting a low and medium sound signal after adding the left and right audio signals, and an amplification output circuit for the low and medium sound signal for amplifying the output of the low and medium sound signal detection circuit, which includes a control signal detection circuit connected between the low and medium sound signal detection circuit and the low and medium sound signal amplification circuit for detecting a peak of the output signal from the low and medium sound signal detection circuit, and a gain control circuit for controlling a signal gain provided by the low and medium sound signal detection circuit according to the output of the control signal detection circuit.

BRIEF DESCRIPTION OF THE DRAWINGS

These and other objects, features, and advantages of the present invention will become more apparent from the following description for the preferred embodiment taken in conjunction with the accompanying drawing, in which.

DETAILED DESCRIPTION OF THE PREFERRED EMBODIMENT

Figure 1:
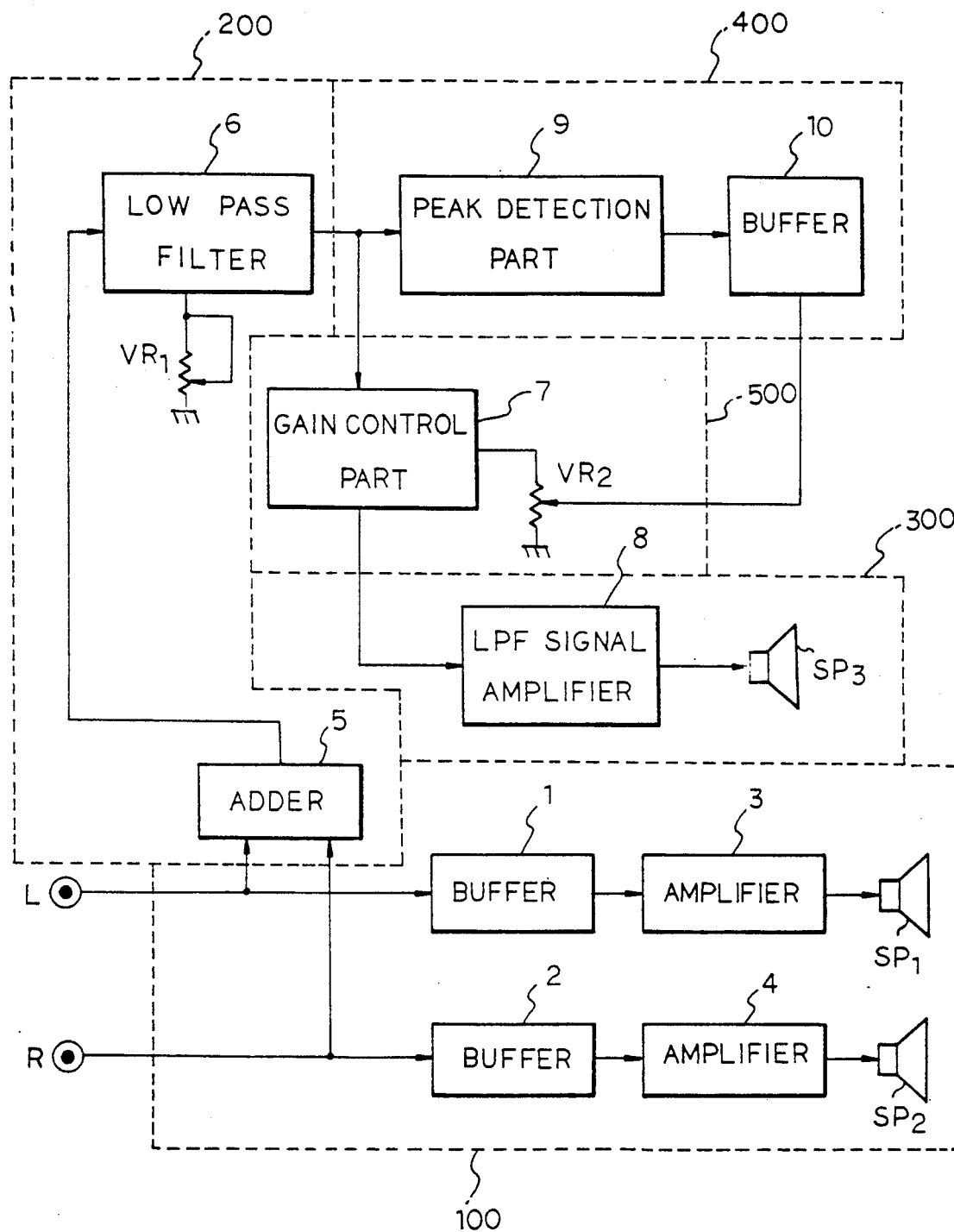
FIG. 1 shows a block diagram of a level control circuit for low and medium sound according to the present invention.

The present invention will be now described in more detail with reference to the accompanying drawing.

FIG. 1 is an embodiment of the present invention. A signal amplification output circuit 100, a low and medium sound signal detection circuit 200 and a low and medium sound signal amplification circuit 300 are the same circuits as the conventional ones.

The audio signal amplification output circuit 100 for amplifying left and right audio signals L and R includes buffers 1 and 2, amplifiers 3 and 4, and speakers SP1 and SP2. The buffers 1 and 2 are connected to the left and right audio signals L and R, respectively, to shape the signals L and R. The amplifiers 3 and 4 are connected to the buffers 1 and 2, respectively, to amplify outputs of the buffers 1 and 2. Further, the speakers SP1 and SP2 are connected to the amplifiers 3 and 4, respectively.

The low and medium sound signal detection circuit 200 which detects the low and medium sound signal after adding the left and right audio signals L and R includes an adder 5 which receives the left and right audio signals and provides an output signal as a result of adding, and a low pass filter 6 which is connected to the adder 5 and passes only a certain current having a specific bandwidth of frequency. A variable resistor VR1 is connected to the low pass filter 6 to control frequencies through the low pass filter 6.

A control signal detection circuit 400 which detects a peak of the output signal from the low and medium sound signal detection circuit 200 includes a peak detection part 9 which detects the peak above a certain level of the output signal from the low and medium sound signal detection circuit 200, and a buffer 10 connected to the peak detection part 9 for shaping the output signal from the peak detection part 9.

A gain control circuit 500 controls the signal gain applied from the low and medium sound signal detection circuit 200 according to the output of the control signal detection circuit 400. The gain control circuit 500 includes a variable resistor VR2 for controlling the output of the control signal detection circuit 400 as a user wishes, and a gain control part 7 connected to the rear side of the variable resistor VR2. The gain control part 7 is controlled by the current amount provided from the variable resistor VR2. Further, the output of the low and medium sound signal detection circuit 200 is applied to the gain control part 7 which controls the applied signal gain according to the current amount coming from the variable resistor VR2.

A low and medium sound signal amplification output circuit 300 which amplifies the output of the gain control circuit 500 includes a LPF signal amplifier 8 and an exclusive speaker SP3 for low and medium sound. The output of the gain control circuit 500 is applied to the LPF signal amplifier 8 which amplifies the applied signal. The output of the LPF signal amplifier 8 is provided to the exclusive speaker SP3 for low and medium sound to drive the exclusive speaker SP3.

The operation of the present invention with the above configuration will now be explained.

The wave form of the left and right audio signals L and R is shaped through the buffers 1 and 2 and the shaped signals are amplified in the amplifiers 3 and 4. While these amplified signals drive the speakers SP1 and SP2, the left and right audio signals L and R are added in the adder 5 to detect the low and medium sound signal which drives the exclusive speaker SP3 for low and medium sound.

The reason of adding the left and right audio signals L and R is because as it is difficult for a man to feel the stereo state of the low and medium sound signal against general audio signals only speaker with a mono signal is necessary for the purpose of having an audio system simplified.

The added output signal from the adder 5 is filtered by the low pass filter 6 to produce only the low and medium sound signal. The bandwidth of the low and medium sound signal output of the low pass filter 6 can be controlled by the variable resistor VR1 connected to the low pass filter 6. In the peak detection part 9, the peaks of low and medium sound signal produced from the low pass filter 6 are detected on the basis of the lower and the higher limits of signal levels. The detected peaks are shaped by the buffer 10.

The shaped signal in the buffer 10 controls the gain control part 7 through the variable resistor VR2. Therefore, the low and medium signal provided from the low pass filter 6 is controlled by the gain control part 7 according to the signal applied from the variable resistor VR2. That is, when the low and medium sound signal goes beyond a certain peak, a signal varying with peak is applied to the gain control part 7 to control the output gain of the low and medium sound signal coming from the low pass filter 6. The output gain of the gain control part 7, thus, can be directly controlled by the variable resistor VR2. The low and medium sound signal with its gain controlled by the gain control part 7 is amplified by the LPF signal amplifier 8, and the amplified signal drives the exclusive speaker SP3 for low and medium sound.

As mentioned above, the level control circuit for low and medium sound may drive the exclusive speaker for low and medium sound by controlling the gain of the low and medium sound signal according to the peak of the low and medium sound signal detected from the left and right audio signals. Therefore, the present invention produces such an effect that the audio system with the above mechanism can provide an enhanced sound output as the system can control its low and medium sound level automatically.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A low and medium sound level control circuit, comprising:
   means for receiving left and right channel audio signals;
   left-channel amplifier means for amplifying said left-channel audio signal to provide amplified left-channel audio signals via a left speaker;
   right-channel amplifier means for amplifying said right-channel audio signal to provide amplified right-channel audio signals via a left speaker;
   adder means for adding said left and right channel audio signals to provide composite signals;
   filter means for filtering said composite signals at a selected bandwidth to provide filtered signals representative of a low and medium audio sound;
   peak detector means coupled to receive said filtered signals representative of said low and medium audio sound, for detecting only peak values of said filtered signals to provide a control signal;
   gain control means coupled to receive said filtered signals representative of said low and medium audio sound, for gain controlling said filtered signals in dependence upon reception of said control signal to provide gain-controlled signals representative of said low and medium audio sound; and
   amplifier means for amplifying said gain-controlled signals representative of said low and medium audio sound to provide amplified gain-controlled signals representative of said low and medium audio sound via an exclusive speaker.

2. The low and medium sound level control circuit as claimed in claim 1, further comprising said peak detector means detecting peak values of said filtered signals representative of said low and medium audio sound to provide peak-detected signals representative of said low and medium audio sound, and means for shaping said peak-detected signals representative of said low and medium audio sound to provide said control signal.

3. The low and medium sound level control circuit as claimed in claim 1, wherein said gain control means comprises a variable resistor for varying voltages applied from said peak detector means, and a gain controller for gain controlling said filtered signals representative of said low and medium audio sound according to an output signal of the variable resistor to provide said gain-controlled signals representative of said low and medium audio sound.

4. A level control circuit for low and medium sound, comprising:
   audio signal adder means for adding left and right audio signals to produce a composite sound signal;
   filter means for filtering and passing said composite sound signal at a selected bandwidth to provide a low and medium sound signal from said composite sound signal;
   amplifier means for amplifying said low and medium sound signal;
   peak detector means for detecting only peak values of said low and medium sound signal to provide a control signal corresponding to the detected peak values; and
   gain control means for passing said low and medium sound signal from said filter means to said amplifier means, and for controlling the gain of said low and medium sound signal on the basis of said control signal to provide a gain controlled low and medium sound signal via an exclusive speaker.

5. A level control circuit for low and medium sound as claimed in claim 1, wherein said peak detector means comprises means for producing said control signal by shaping said detected peak signal.

6. A level control circuit for low and medium sound as claimed in claim 1, wherein said gain control means comprises a variable resistor for varying voltages applied from said peak detector means, and a gain controller for gain controlling said low and medium sound signal in accordance with the output signal of said variable resistor to provide said gain controlled low and medium sound signal.

7. A low and medium sound level control circuit in an audio sound system having a pair of amplifiers for driving left and right audio signals to a pair of speakers, comprising:

adder means for receiving said left and right audio signals to provide composite signals;

filter means for filtering said composite signals at a specific bandwidth selected by a variable resistor to provide filtered signals representative of a low and medium audio sound;

peak detector means having a peak detector coupled to receive said filtered signals representative of said low and medium audio sound, for detecting only peak values of said filtered signals representative of said low and medium audio sound, and means responsive to the detected peak values to provide a control signal;

gain control means having a gain control controller coupled to receive said filtered signals representative of said low and medium audio sound, and a variable resistor coupled to receive said control signal for controlling signal gains of said filtered signals representative of said low and medium audio sound in accordance with currents provided from said variable resistor to provide gain adjusted filtered signals of said low and medium audio sound; and amplifier means for amplifying and driving said gained adjusted signals representative of said low and medium audio sound through an exclusive speaker.

* * * * *

UNITED STATES PATENT AND TRADEMARK OFFICE
CERTIFICATE OF CORRECTION

PATENT NO. : 5,175,770
DATED : 29 December 1992
INVENTOR(S) : Dong-Cherl BACK

It is certified that error appears in the above-indentified patent and that said Letters Patent is hereby corrected as shown below:

Column 3, line 67, after "audio", change "signal" to --signals--;

Column 4, line 2, after "audio", change "signal" to --signals--;

line 3, before "speaker", change "left" to --right--:

Signed and Sealed this

Twenty-seventh Day of August, 1996

Attest:

BRUCE LEHMAN

Attesting Officer

Commissioner of Patents and Trademarks